United States Patent [19]

Gevelber et al.

[11] Patent Number: 4,943,160
[45] Date of Patent: Jul. 24, 1990

[54] INTERFACE ANGLE ESTIMATION SYSTEM

[75] Inventors: Michael A. Gevelber, Newtonville; Anthony T. Patera, Watertown, both of Mass.

[73] Assignee: Massachusetts Institute of Technology, Cambridge, Mass.

[21] Appl. No.: 224,490

[22] Filed: Jul. 25, 1988

[51] Int. Cl.$^5$ .............................................. G01B 11/00
[52] U.S. Cl. .................................... 356/372; 356/394; 356/138
[58] Field of Search ............... 356/138, 384, 385, 372, 356/135, 32, 394

[56] References Cited

U.S. PATENT DOCUMENTS

| 4,342,907 | 8/1982 | Macedo et al. | 356/32 |
| 4,653,104 | 3/1987 | Tamura | 356/376 |
| 4,692,024 | 9/1987 | Bloss | 356/135 |

Primary Examiner—Léon Scott, Jr.
Attorney, Agent, or Firm—Fish & Richardson

[57] ABSTRACT

An interface angle estimation system comprising thermal and surface imagers and apparatus for determining an interface angle. The imagers provide imaging data to the interface angle determining apparatus, which determines the interface angle.

18 Claims, 4 Drawing Sheets

INTERFACE ANGLE ESTIMATION SYSTEM

BACKGROUND OF THE INVENTION

The United States Government has rights in this invention under contract number F33615-83-C-5284 with DARPA and the United States Air Force.

A crystal's interface shape can be related to the quality of the growing crystal. Specific crystal quality features related to interface shape include: thermal stress and dislocation formation, segregation behavior of the growing crystal, and the ability to grow-out defects from the crystal. While it has been long known that interface shape is important in the Czochralski crystal growth process, no active control system has been designed to control the interface shape. Currently, diameter control is the only feedback control used in maintaining the crystal growth dynamics in the Czochralski process. X-ray systems are available to allow the measurement of the crystal diameter interface shape, S. Ozawa and T. Fukada, *Journal of Crystal Growth*, 76 (1986) 323. The measurement provided by an x-ray system has not been used in a feedback system for interface shape control, however. Other recent analyses have proposed a feed-forward approach. Derby, J. et al., *Journal of Crystal Growth*, 75 (1986) 227 and Srivastava, R. et al., *Journal of Crystal Growth*, 76 (1986) 395. A system employing such a feed-forward approach would be highly sensitive and would have a small error tolerance.

SUMMARY OF THE INVENTION

In general, the invention features an interface angle estimation system having thermal and surface imagers and apparatus for determining the interface angle, wherein the imagers provide imaging data to the interface angle determining apparatus that determines the interface angle.

In preferred embodiments, the imaging data is temperature gradient data such as from around a material s triple junction provided by a light-sensitive camera or an optical fiber thermometer and surface orientation data such as from the surface around a material's triple junction provided by a plurality of cameras; the thermal imager includes thermal imaging apparatus and a parameter estimator for the calibration of a signal from an imaged surface; the parameter estimator includes a portable polarizer as a noise filter, apparatus for maintaining the orientation of a thermal signal, and provides parametric data to the apparatus for determining the interface angle; the apparatus for determining the interface angle is digital or analog software or hardware; the apparatus implements an algorithm to determine the interface angle; and the apparatus determines the interface angle for a Czochralski-grown crystal or for a solid-liquid interface region of a welded material in a weld control system.

In another aspect, the invention features an interface angle estimation system having thermal and surface imagers, apparatus for determining the interface angle, and a control system for crystal growth, wherein the interface angle is provided to the control system which, in turn, controls inputs for crystal growth.

In further preferred embodiments, the control system includes an interface shape reconstructor and the interface angle is used as a feedback signal in the control system.

The interface contact angle $\theta_i$ is important because it is a characteristic of the interface shape and can be used in a control structure to maintain the interface shape throughout the growth run of a crystal growth process. Because the use of the interface angle measurement can be related to important interface shape characteristics that require control, a feedback controller that uses $\theta_i$ can make required input adjustments as a crystal is growing, thus compensating for modeling errors, input errors, and system time variations.

Other advantages and features of the invention will be apparent from the following description of the preferred embodiments, and from the claims.

DESCRIPTION OF THE PREFERRED EMBODIMENTS

The interface angle imaging system of the present invention provides an estimate of the interface contact angle at a growing crystal's interface triple junction. This interface contact angle $\theta_i$ is characteristic of a crystal's interface shape. An accurate estimate of $\theta_i$ can be used in a control system to maintain the interface shape throughout the growth run of the Czochralski process. The estimate of the interface contact angle $\theta_i$ can be used for real time feedback control of the interface shape and of local thermal gradients at the interface. Control of these features is particularly important for the growth of compound semiconductors (such as GaAs and InP), but is also important for elemental semiconductors (such as Si and Ge) as well as other crystals.

Figure 1:
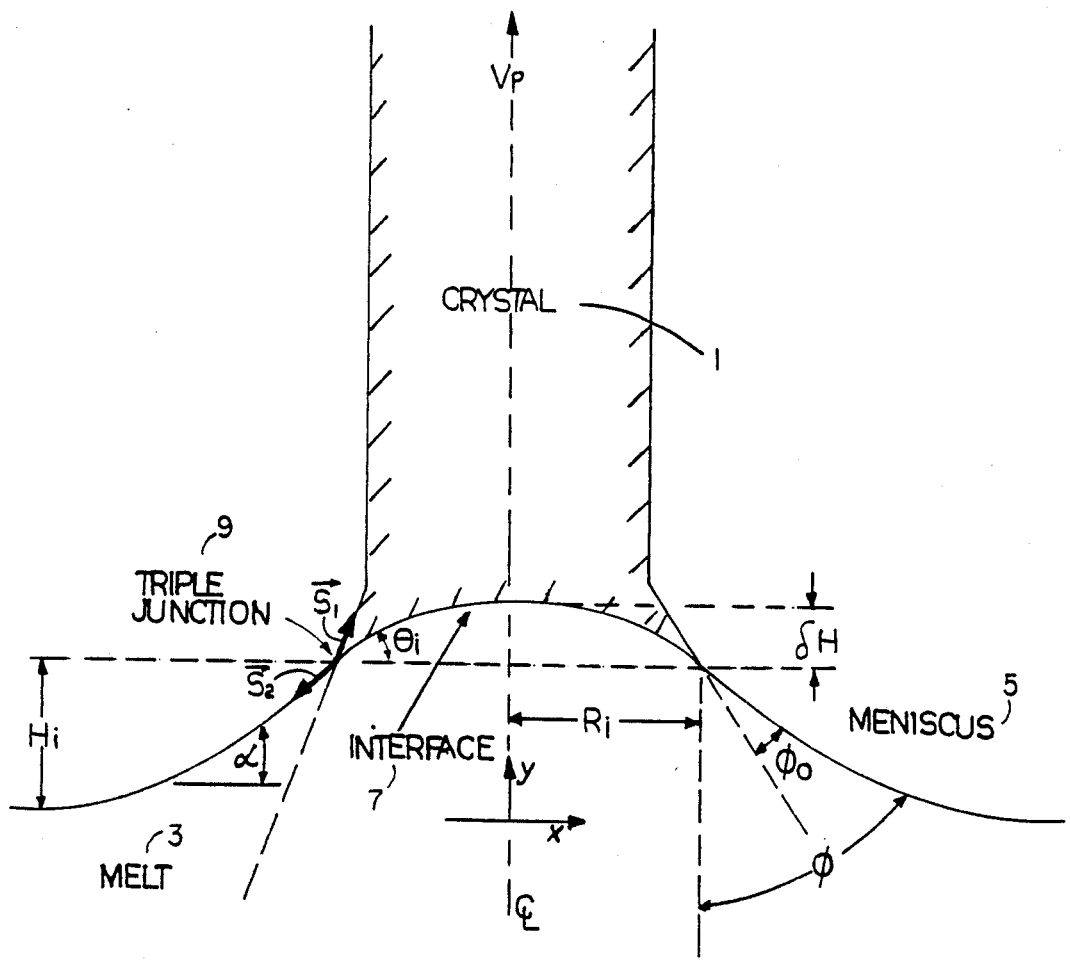
FIG. 1 shows a crystal growing from a melt.

The control system of the present invention uses an algorithm to estimate the interface surface contact angle $\theta_i$, FIG. 1. Crystal 1 is shown growing from melt 3, and has meniscus 5 and interface 7. Triple junction 9 defines the end point of the interface between crystal 1 and meniscus 5. The algorithm used in the estimation system, discussed more completely below, uses temperature gradient measurements around the triple junction as well as measurements of the surface orientation of the crystal and the meniscus about this point to estimate $\theta_i$. This estimate could then be used for real time feedback control of both the interface shape and local thermal gradients at the interface.

Two cases are identified in estimating $\theta_i$. In the first, continuous thermal gradients extend across the interface. In the second, discontinuous gradients are present. The discontinuous gradients are caused by different conductivities of the solid and the melt and/or the significant release of latent heat in the liquid-solid phase transformation The system is assumed to be in quasiequilibrium, which is valid if the measurement is made much faster then the interface changes shape.

In the continuous case, it is desirable to determine the interface isotherm $S_i$ near the triple junction from temperature gradient measurements along the crystal and meniscus surfaces as depicted in FIG. 1. The surface orientations are given by the unit vector $\underline{S}_1$ for the solid and $\underline{S}_2$ for the liquid. The vectors must be determined when the temperature measurements are made. The angle between $\underline{S}_1$ and $\underline{S}_2$ is not always $\phi_0$.

The vectors are represented in the Cartesian coordinate system by $\underline{S}_1 = (\alpha, \beta)$ and $\underline{S}_2 = (\gamma, \delta)$. The surface temperature gradients are approximated by temperature measurements $\Delta T_1$ and $\Delta T_2$ taken at points $\Delta \eta$ and $\Delta \epsilon$ along vectors $\vec{S}_1$ and $\vec{S}_2$, respectively, FIG. 1.

The measured gradients $\Delta T_1$ and $\Delta T_2$ are related to the thermal gradient $\underline{\nabla} T$ by expanding the approximation $\underline{S} * \underline{\nabla} T / \Delta x$ for each surface. (The operator * is the vector dot product; $\underline{\nabla}$ is the gradient operator.) The components of $\underline{\nabla} T = (\partial T / \partial x, \partial T / \partial y)$ can be expressed as:

$$\frac{\partial T}{\partial x} = \frac{1}{\alpha \delta - \beta \gamma} \left[ \delta \frac{\Delta T_1}{\Delta \eta} - \beta \frac{\Delta T_2}{\Delta \epsilon} \right] \quad \text{(E.1)}$$

$$\frac{\partial T}{\partial y} = \frac{1}{\alpha \delta - \beta \gamma} \left[ -\gamma \frac{\Delta T_1}{\Delta \eta} + \alpha \frac{\Delta T_2}{\Delta \epsilon} \right]$$

The interface surface vector $\underline{S}_i$ is perpendicular to $\underline{\nabla} T$, and is given by:

$$\underline{S}_i' = \frac{1}{\alpha \delta - \beta \gamma} \begin{bmatrix} \gamma \frac{\Delta T_1}{\Delta \eta} - \alpha \frac{\Delta T_2}{\Delta \epsilon} \\ \delta \frac{\Delta T_1}{\Delta \eta} - \beta \frac{\Delta T_2}{\Delta \epsilon} \end{bmatrix} \quad \text{(E.2)}$$

where (') denotes the vector conjugate. $\theta_i$ can then be expressed by:

$$\theta_i = \tan^{-1} \left[ \frac{\delta \frac{\Delta T_1}{\Delta \eta} - \beta \frac{\Delta T_2}{\Delta \epsilon}}{\gamma \frac{\Delta T_1}{\Delta \eta} - \alpha \frac{\Delta T_2}{\Delta \epsilon}} \right] \quad \text{(E.3)}$$

In the discontinuous case, the preceding calculations must be modified. Whereas in the continuous case, $\underline{\nabla} T$ was the same around the triple point, in the discontinuous case, the gradients on each side of the interface ($\underline{\nabla} T_1$ for the solid and $\underline{\nabla} T_2$ for the liquid) are different due to the discontinuity.

The interface surface gradients must, however, point in the same direction since they define the same surface. The ratio of the liquid to the solid thermal gradients may be expressed as a multiplicative constant, $C_f$. The three quantities are related as follows:

$$\underline{\nabla} T_1 = C_f \times \underline{\nabla} T_2 \quad \text{(E.4)}$$

The surface gradients can be related to the measurements using equation E.4 by:

$$\alpha C_f \frac{\partial T_2}{\partial x} + \beta C_f \frac{\partial T_2}{\partial y} \sim \frac{\Delta T_1}{\Delta \eta} \quad \text{(E.5)}$$

$$\gamma \frac{\partial T_2}{\partial x} + \delta \frac{\partial T_2}{\partial y} \sim \frac{\Delta T_2}{\Delta \epsilon}$$

Following equation E.3 one obtains:

$$\theta_i = \tan^{-1} \left[ \frac{\delta \frac{\Delta T_1}{\Delta \eta} - \beta C_f \frac{\Delta T_2}{\Delta \epsilon}}{\gamma \frac{\Delta T_1}{\Delta \eta} - \alpha C_f \frac{\Delta T_2}{\Delta \epsilon}} \right] \quad \text{(E.6)}$$

$C_f$ is approximated by an energy balance in the local area of the junction. Using a thin control volume about the interface near the interface rear the junction so that the surface cooling can be ignored, the energy balance is given by:

$$k_1 (\underline{A} * \underline{\nabla} T_1) = k_2 (\underline{A} * \underline{\nabla} T_2) + \rho H_f (\underline{A} * \underline{V}) \quad \text{(E.7)}$$

where $\underline{V}$ is the local relative velocity of the material through the interface, $\underline{A}$ is the cross sectional area of the control volume, $k_1$, $k_2$ are the thermal conductivities of the different regions, $\rho$ is the density, and $H_f$ is the specific heat of fusion. Substituting equation E.4 into E.7, one obtains:

$$C_f = \frac{k_2}{k_1} + \frac{\rho H_f (\underline{A} * \underline{V})}{k_1 (\underline{A} * \underline{\nabla} T_2)} \quad \text{(E.8)}$$

The difference between the two cases (equations E.3 and E.6) is due to $C_f$. In the limiting case when the conductivities are the same and $H_f$ is small, then $C_f \sim 1$ and the equations for $\theta_i$ are equivalent.

The vector products are evaluated by $$\underline{A} * \underline{V} = |\underline{A}| * |\underline{V}| * \cos \phi_i \quad \text{(E.9)}$$

where $\phi_i = \pi/2 - \theta_i$, and:

$$\underline{A} * \underline{\nabla} T_2 = |\underline{A}| \times |\underline{\nabla} T_2| \quad \text{(E.10)}$$

since the gradient and the interface surface are perpendicular.

The gradients are related to the measurement by:

$$\frac{\partial T_2}{\partial x} = \frac{1}{C_f(\alpha \delta - \beta \gamma)} \left[ \delta \frac{\Delta T_1}{\Delta \eta} - \beta C_f \frac{\Delta T_2}{\Delta \epsilon} \right] \quad \text{(E.11)}$$

$$\frac{\partial T_2}{\partial y} = \frac{1}{C_f(\alpha \delta - \beta \gamma)} \left[ -\gamma \frac{\Delta T_1}{\Delta \eta} + \alpha C_f \frac{\Delta T_2}{\Delta \epsilon} \right]$$

Expressions E.9, E.10, and E.11, used in equation E.8 and combined with equation E.6, yield a pair of nonlinear equations in terms of $C_f$ and $\theta_i$. These equations can be solved numerically for $\theta_i$, given $\underline{S}_1$, $\underline{S}_2$, $\Delta T_1/\Delta \eta$, and $\Delta T_2/\Delta \epsilon$.

Figure 2:
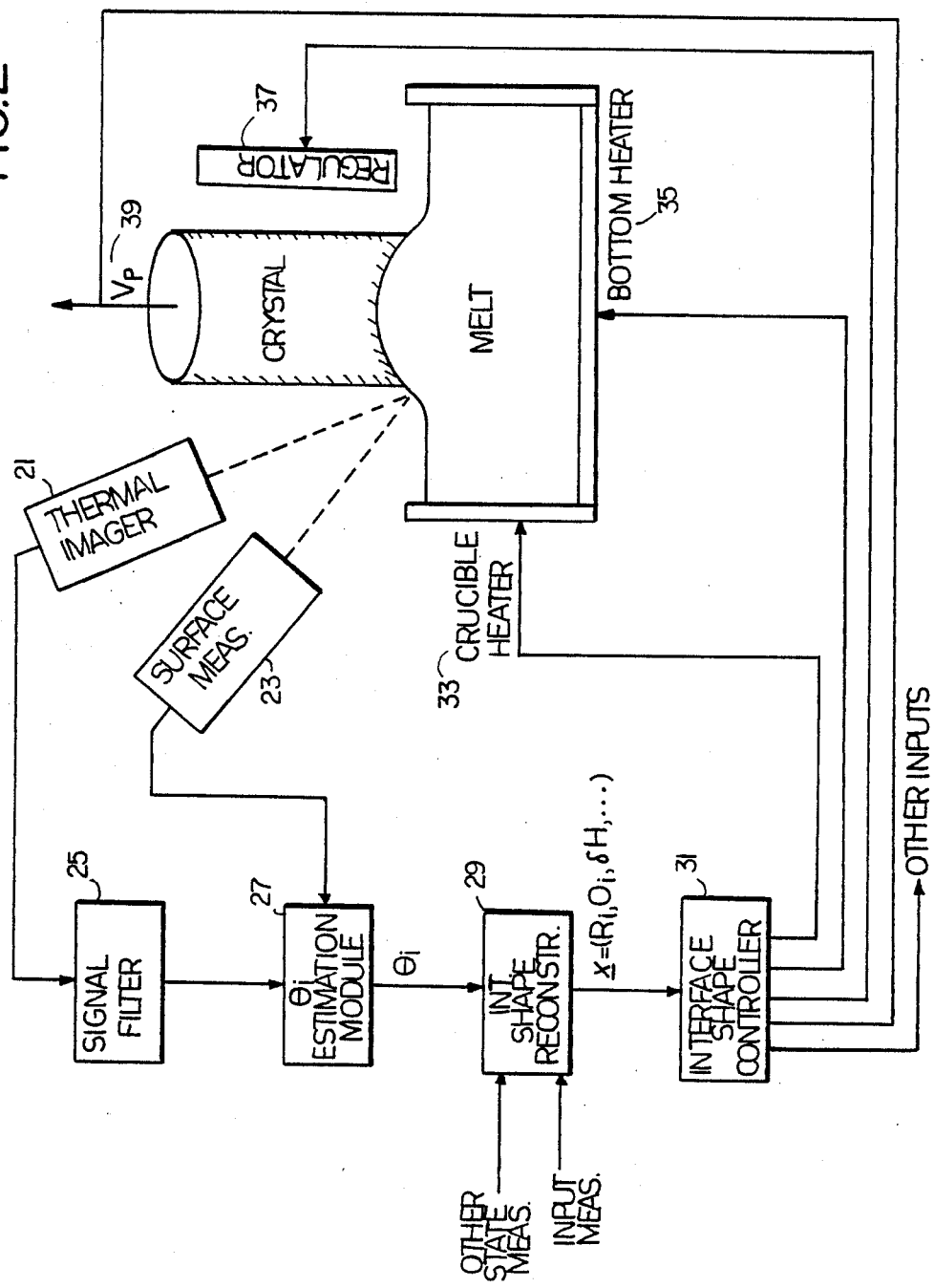
FIG. 2 is a block diagram of an interface angle estimation system with a feedback control for interface shape.

FIG. 2 is a block diagram of an embodiment of the invention in which the interface angle estimation system is used in a crystal growth control system. The components of this control system include thermal measurement system 21, which determines the temperature gradients on the meniscus and crystal surfaces about the triple point, surface measurement system 23, which determines the orientation of the meniscus and crystal surfaces, and $\theta_i$ estimation module 27 comprising software and/or hardware of either digital or analog character to implement the interface angle estimation algorithm.

When the interface angle estimation system is to be used as a feedback signal for interface shape control as in FIG. 2, it could also include an interface shape controller that would control inputs such as crucible wall heater 33, crucible bottom heater 35, crystal cooling zone thermal regulator 37, and crystal puller 39. These inputs would be adjusted to maintain the desired interface shape. Additional inputs for the controller could include the rotation of the crystal seed and/or crucible, the magnetic field, and the interface region heat transfer.

The interface angle $\theta_i$ generated by the estimation system could also be used by an interface shape reconstructor 29 that would estimate other attributes of the interface shape. Shape reconstructor 29 would utilize a model of the internal heat transfer characteristics of the process using to input values in addition to $\theta_i$, including the crystal diameter and the melt temperature, to estimate other characteristics of the melt interface shape. These characteristics include the center deflection $\delta H$ of the meniscus (FIG. 1), and whether the interface is sigmodal.

Figure 3:
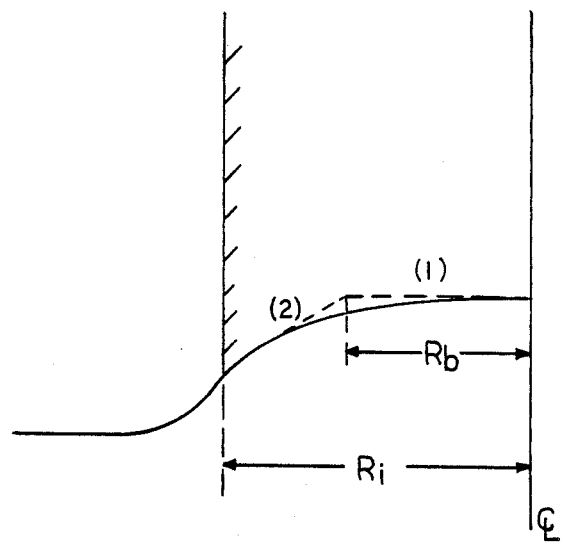
FIG. 3 shows an interface shape approximated as two linear regions.

An example of how $\theta_i$ can be used in the shape reconstructor to estimate $\delta H$ is illustrated in FIG. 3, where the interface shape is approximated as two linear regions. The geometry of the approximation yields $\delta H = (R_i - R_b) \cdot \tan \theta_i$, where a model of the local heat transfer could be used to estimate $R_b$. More detailed models shape could be used to obtain a more accurate estimate of the interface shape.

Various methods can be used to determine the variables used in the calculation of the interface angle $\theta_i$. Thermal imager 21, FIG. 2, used to obtain surface temperatures, could use a camera whose signal was processed based on the intensity of the light detected. One such system is described by Wargo, "Thermal Imaging of High Temperature Semi-Conductor Melts," *Proc. NASA Workshop on Non-Contact Temperature Measurement* (1987) and uses a CCD camera, band pass filters, and a computer for signal processing. Another option for the thermal imager would be an optical pyrometer that used optical fibers placed near the interface region The optical fiber thermometer system produced by Accufiber Inc. is a commercially available system that could be used in this manner.

Figure 4:
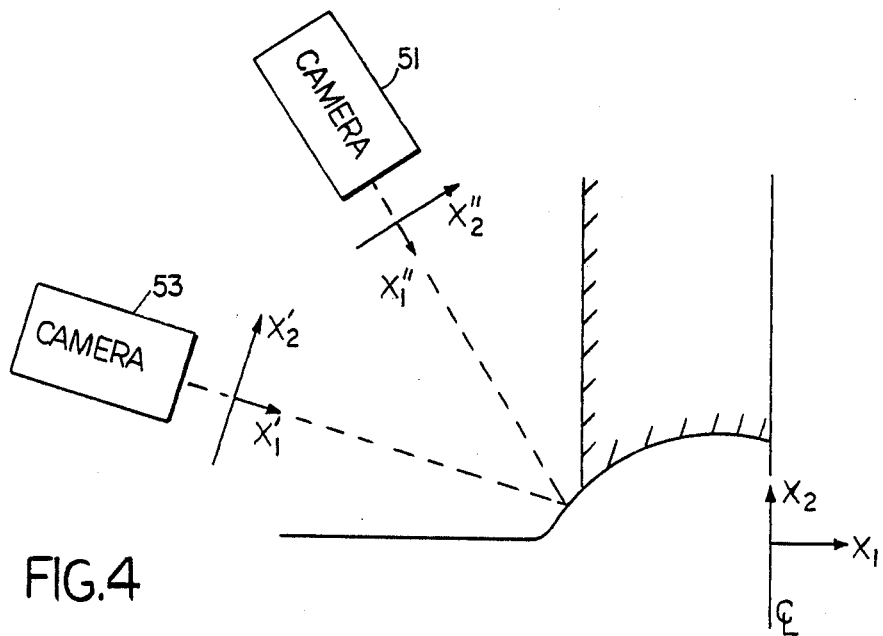
FIG. 4 shows an imaging system for use in obtaining surface vectors.

The surface vectors used in the estimation system could be obtained by several measurement and estimation techniques. In one example, a direct measurement of the crystal and interface surfaces could be obtained from two cameras whose signals were suitably processed to reflect the geometry of the measurement system, FIG. 4. According to this method, both cameras 51 and 53 would be used to identify a common point such as the triple point. The camera images of surfaces $x_1'$, $x_2'$ and $x_1''$, $x_2''$ would be mapped into the $(x_1, x_2)$ space of the real system. Laser light or other radiation could also be used to determine the surface orientation by timing the reflections from those surfaces. Surface orientation could also be determined using estimation techniques based on a measurement of the meniscus angle $\phi$, since it relates the orientation of the meniscus to the orientation of the crystal surface. Measurements of $R_i$ and $H_i$, FIG. 1, could be used to determine $\phi$ as in Gevelber et al., *Journal of Crystal Growth* [accepted for publication].

The interface angle estimation system must also compensate for the time varying geometry of the system. This variation is caused by the decreasing melt level as the crystal grows or by the relative change of the crucible position in the system. Compensation can be provided by either changing the angles and position of the measurement system, and/or by adjusting the surface and gradient portions of the estimation algorithms.

To assure the accuracy of the measurements used by the estimation system, it is desirable to provide a means for calibrating those measurements, especially the temperature measurement. As any error in $\theta_i$ will affect the performance of a feedback control system, it is important to minimize any estimation errors. Sources error include: noise due to reflections that corrupt the thermal imaging signal, errors in the physical parameters used in the estimation algorithm, and improper compensation in the imaging system for the time-varying behavior of the meniscus region and the changing optical viewpaths caused by the decreasing melt level.

Several methods are contemplated that would minimize estimation errors. One cause of errors is light sources within the Czochralski system, which can produce a false signal in the thermal imaging system by reflecting from the imaging surfaces. One way to eliminate these noise signals from the true thermal image would employ a polarizer. Since reflected light is polarized, the use of a polarizer before the thermal imaging system would attenuate the surface light noise in the signal. Since the degree of polarization of reflected light varies with the reflection angle and surface properties of the material, the performance of a polarizing system is variable. Highly reflecting materials such as GaAs and Si do not significantly polarize visible light. As a result, crystal growth systems for such materials probably would not be able to effectively use a light polarization noise eliminator. However, optical crystals grown by the Czochralski method would probably make better use of this technique.

Figure 5A:
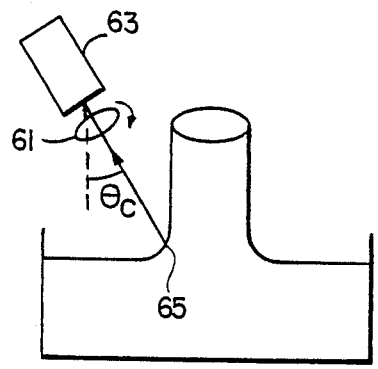
FIG. 5a and FIG. 5b show thermal imager calibration systems.

FIG. 5a shows a basic noise filter comprising polarizer 61 that could be rotated azimuthally. polarizer 61 attenuates the reflected light from the imaging surface 65 detected by camera 63, thereby increasing the ratio of signal (i.e. the light intensity emitted by surface 65 proportional to its temperature) to noise (i.e. the reflected light) of the thermal image system. During the imaging process, polarizer 61 would be rotated until the signal reached its lowest value. At this point, the reflected light would be attenuated most highly, yielding a signal with the highest possible signal to noise (S/N) ratio. During this tuning period, the thermal imaging signal would not be used by the $\theta_i$ estimator and the control system. The filtering system could be operated repeatedly at preset intervals to continually achieve the best S/N during the changing process geometry.

The degree to which reflected light is polarized depends on its reflection angle and the optical properties of the material. Thus, it is desirable to view the reflected light at an angle $\theta p$ which maximizes the polarization since at this angle, the S/N will be greatest. This angle can be calculated from the properties of the material, and is equal to:

$$\theta p_{max} = \tan^{-1} \frac{n_2}{n_1}$$

where $n_i$ is the index of refraction for material i. The thermal imaging system could be mounted on a movable system that would allow it to image the target surface at the camera viewing angle $\theta_c$ at which polarization of the reflected light is greatest.

Figure 5B:
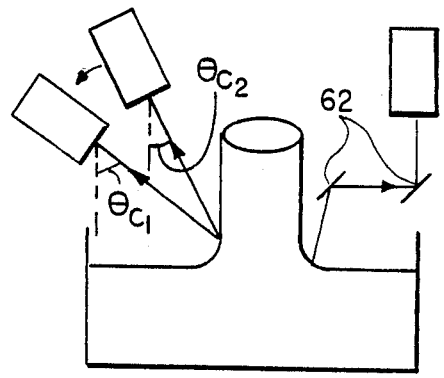
Figure 6:
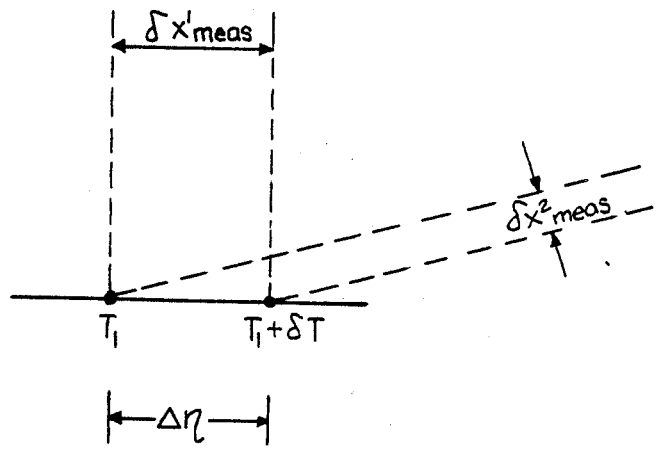
FIG. 6 shows the effect of varying the viewing angle $\theta_c$ in a thermal imaging system.

Another important consideration for the accuracy of the interface angle estimate is the selection of the camera angle $\theta_c$, FIG. 5b. This angle's selection affects the gradient resolution. The spatial resolution $\delta x_{meas}$ of the surface temperatures, used to calculate the temperature gradient, is largest ($\delta x'_{meas}$), as $\theta_c$ approaches normal incidence as illustrated in FIG. 6. However, the optimum $\theta_c$ might be different for the two cases where the best polarization and the best spatial resolution are sought. The trade-off may be analyzed either analytically, such as in real time by a computer program, or experimentally.

A tuning procedure similar to the one used to select the polarizer angle $\theta_p$ could also be used to choose $\theta_c$ with respect to the imaging surface. First, the angle corresponding to the imaging surface would be determined. Camera viewing angle $\theta_c$ would then be adjusted about the optimal value of $\theta_c$ (based on $\theta_{p_{max}}$) until the lowest signal level was achieved. This point would be considered to be the highest S/N position. The tuning procedure that would be used to tune for both angle $\theta_c$ and polarizer angle $\theta_p$ would first fix the camera orientation and then change the polarization filter. This procedure could be followed at pre-determined time intervals selected by the user.

Another consideration is the changing melt level. As the crystal grows longer, the melt is depleted. This lowers the melt surface and changes the orientation of the melt surfaces with respect to the thermal imaging system. A moveable camera mounting system could be programmed to change the camera-interface orientation over the growth run to correct for the changing system geometry. In some cases, as the melt level decreased, the ability to adjust for the viewable measurement angle may eventually be constrained as the walls of the crucible interfered with the signal path. This limitation might affect the effectiveness of the polarizer noise filter and ultimately compromise the estimate of $\theta_i$ since it would constrain the usable $\theta_c$. One solution to this problem would use mirrors 62, FIG. 5b that could be mounted on a positioning system that would maintain a desired orientation with respect to the imaging surface. The mirror reflection angle would be chosen to prevent significant polarization of the signal, thus permitting the use of the polarizing noise filter.

The accuracy of the interface angle estimation system is also limited by material property values, including the thermal conductivity of the liquid and solid phase ($k_1$, $k_2$), the density of the solid, ($\rho$) and the specific heat of fusion ($H_f$). Errors in these property values will result in an error in the $\theta_i$ estimate. To correct for any such errors, an automatic parameter identification system could be used when estimating $\theta_i$. This system would calculate the best fit of the parameters to observed thermal imaging data in combination with the actual interface angle $\theta_i$ of the crystal. Such a system could only be used off-line (i.e. not used during a production run) since the crystal would have to be sliced after the growth run to determine the actual $\theta_i$ at the time of the measurement.

The measurements for parameter identification are all taken about a constant temperature (i.e. the melting point of crystal material). Such a tuning procedure would therefore provide good estimates of the algorithm constants since they correspond to points that change only slightly about a fixed temperature.

Equation E.1, which relates the gradient and surface orientation measurements, can be reduced to the constant $C_f$ by:

$$\frac{1}{C_f(\alpha\delta - \beta\gamma)} (F_1^2 + F_2^2) \left( C_f - \frac{k_1}{k_2} \right) - \frac{\rho \cdot H_f}{k_1} \underline{V}_1 F_2 = 0 \qquad (E. 12)$$

where $$F_1 = \delta \frac{\Delta T_1}{\Delta \eta} - \beta C_f \frac{\Delta T_2}{\Delta \epsilon} \qquad (E. 13)$$

$$F_2 = \gamma \frac{\Delta T_1}{\Delta \eta} - \alpha C_f \frac{\Delta T_2}{\Delta \epsilon} \qquad (E. 14)$$

$$\underline{V}_{1r} = V_p - H_i - H_m \qquad (E. 15)$$

Equation E.12 is used to estimate $\theta_i$ by first solving numerically for the value of $C_f$ and then using the relationship:

$$\theta_i = \tan^{-1}\left( \frac{F_1}{F_2} \right) \qquad (E. 16)$$

Figure 7:
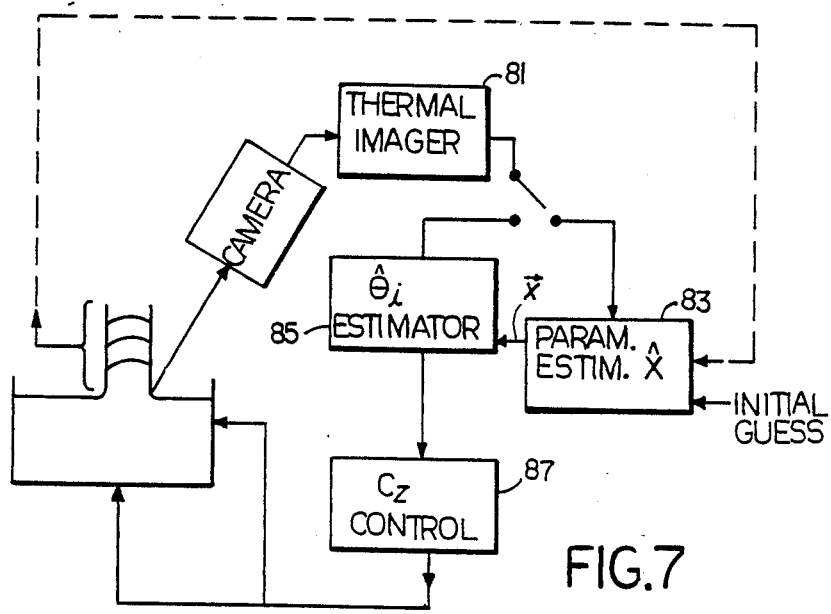
FIG. 7 is a block diagram of a crystal growth control system with an interface angle estimator that uses a parameter identification system.

The value of $C_f$ depends on the property values. In one embodiment of the interface angle estimation system, the property values used would be obtained by parameter identification techniques using thermal imaging system 81, FIG. 7, instead of relying on published values. The parameters would be obtained by analyzing data from thermal imager 81 and the corresponding $\theta_i$ (obtained by post-mortem analysis of the solid as indicated by broken lines in FIG. 7). $\theta_i$ can be obtained throughout the growth run by identifying the interface by electrical interface demarcation techniques, M. Lichtensteiger et al., *J. Electrochem. Soc.* 115 (1968) 438, or by correlating the growth striations when dopants are used.

During the parameter identification procedure, the signal from thermal imager 81 is used by parameter estimator 83. After the parameters were identified, the output values x would be used by $\theta_i$ estimator 85 in a separate growth run. The signal from thermal imager 81 would then be shunted to $\theta_i$ estimator 85.

In one parametric identification algorithm that combines the thermal gradient measurement and $\theta_i$, the values of the parameters could be determined using least square estimation techniques by making N observations. The functional relationship of the measurements and the parameters to be estimated is given by:

$$\vec{F}(\vec{x}) = |\nabla T_2| \left( C_f - \frac{k_2}{k_1} \right) - \frac{\rho H_f}{k_1} V_r \cos \theta_i = 0 \qquad (E.17)$$

where:

$$|\nabla T_2| = \frac{1}{C_f(\alpha\delta - \beta\gamma)} (F_1^2 + F_2^2)^{\frac{1}{2}} \qquad (E.18)$$

and $\vec{x} = (\hat{k}_1, \hat{k}_2, \hat{\rho}, \hat{H}_f)$ (the vector of the parameters to be estimated), ^ denotes that the parameter is an estimate, and $\vec{F}$ is a vector function of all N observations. The $i^{th}$ observation can therefore be written:

$$F_i(\vec{x}) = |\nabla T_2(i)| \left( C_i(i) - \frac{k_2}{k_1} \right) - \frac{\rho H_f}{k_1} V_1(i) \cos \theta_i(i) = 0 \quad \text{(E. 19)}$$

One can obtain the least square estimate of the parameters $\vec{x}$ by iteration, first linearizing the set of N equations of the form given by equation E.17, and then solving the least squares problem. This would be repeated until convergence was achieved. Equation E.17 can be linearized about an initial guess $\vec{x}(0)$ and expressed as:

$$\vec{F}(\vec{x}(0)) + \frac{\partial F}{\partial x} \cdot \vec{\delta x} = 0. \quad \text{(E. 20)}$$

This guess would be input into estimator 83. Equation E.20 can be rewritten in matrix form as:

$$A * \vec{\delta x} = \vec{b} \quad \text{(E. 21)}$$

where $\vec{\delta x}$ is the increment to $\vec{x}$, A is the Jacobian of $\vec{F}(\vec{x})$ with respect to the parameters in $\vec{x}$, and $\vec{b} = \vec{F}(\vec{x}(0))$.

The least squares estimate of the parameters is then obtained by solving:

$$\vec{\delta x} = (A^* A')^{-1} * A' * \vec{b} \quad \text{(E. 22)}$$

by standard numerical techniques. The parameters in x are updated by:

$$\vec{x}^{j+1} = \vec{x}^j + \vec{\delta x}^j \quad \text{(E. 23)}$$

where (j) is the $j^{th}$ iteration.

The equations of form equation E.17 are re-evaluated at the new estimate $x^{j+1}$, and a new least squares solution is obtained. This process is continued until a convergence limit is reached. In this embodiment, since there are 4 parameters that are being estimated, there should be at least 8 observations taken to solve the least squares problem. The resulting parameter values are then used in $\theta_i$ estimator 85, FIG. 7.

The use of the interface angle estimation system is not restricted to the control of Czochralski crystal growth. In another embodiment, the interface angle estimation system could be used in a real-time closed loop controller for welding applications. Welding involves a phase transformation similar to that seen in Czochralski crystal growth, as it involves a molten pool having a solid-liquid interface. During welding, the weld controller has no available information about its performance, such as the depth of the weld pool. Weld rod input power does not provide adequate control, as noted by Karniakakis, G. E., "Development and Experimental Validation of a Predictive Model for a GTA Weld Pool Geometry", Masters Thesis, Massachusetts Institute of Technology, June 1984, and Saedi, H. R., "Transient Response of Plasma Arc and Weld Pool Geometry for STAW Process", PhD Thesis, Massachusetts Institute of Technology, May 1986. The estimator could use a signal from an imager focused on the solid liquid metal interface region to provide the addition interface angle data that would improve the weld.

The invention of the interface angle estimation technique could also be used with crystal growth techniques other than the Czochralski process. The interface shape is important in other growth systems. Other processes in which the present invention would be useful include systems having an interface due to a phase transformation where only surface measurements are available, or in which direct interface measurements are difficult to obtain.

The invention disclosed herein is not limited to the specific examples described. Various other embodiments can be used according to the invention to estimate the interface angle.

What is claimed is:

1. An interface angle estimation system comprising: thermal and surface imagers and means for determining an interface angle $\theta_i$ at an interface triple junction of a crystal growing from a melt material wherein the thermal imager provides temperature gradient data surface orientation data from the crystal and from a meniscus around the triple junction to the means and wherein the means determines the interface angle.

2. An interface angle estimation system according to claim 1 wherein the means for determining the interface angle comprises digital software or digital or analog hardware.

3. An interface angle estimation system according to claim 2 wherein the software or hardware implements an algorithm to determine the interface angle.

4. An interface angle estimation system according to claim 1 wherein a light-sensitive camera or an optical fiber thermometer in the thermal imager provides the temperature gradient data.

5. An interface angle estimation system according to claim 4 wherein a plurality of cameras in the surface imager provides the surface orientation data.

6. An interface angle estimation system according to claim 1 wherein the means for determining the interface angle determines the interface angle for a crystal grown according to the Czochralski process.

7. An interface angle estimation system according to claim 1 wherein the means for determining the interface angle determines the interface angle for a solid-liquid interface region of a welded material in a weld-control system.

8. An interface angle estimation system according to claim 1 wherein the thermal imager includes means for thermal imaging and a parameter estimator of material properties of the crystal material for the calibration of the interface angle estimation system.

9. An interface angle estimation system according to claim 8 wherein the parameter estimator includes a noise filter, the noise filter comprising a portable polarizer between the thermal imaging means and the imaged surface.

10. An interface angle estimation system according to claim 8 wherein the parameter estimator includes means for maintaining the orientation of a thermal signal between the thermal imaging apparatus and the imaged surface.

11. An interface angle estimation system according to claim 1 further comprising a parameter estimator of material properties of the crystal material, wherein the thermal imager provides imaging data to the parameter estimator, and wherein the parameter estimator provides parametric data to the means for determining the interface angle.

12. An interface angle estimation system comprising thermal and surface imagers, means for determining an interface angle $\theta_i$ at an interface triple junction of a crystal growing from a melt material and a control system for crystal growth, wherein the thermal imager provides temperature gradient data from around the triple junction and the surface imager provides surface orientation data from the crystal and from a meniscus around the triple junction to the means, wherein the means determines and provides to the control system the interface angle, and wherein the control system controls inputs for crystal growth.

13. An interface angle estimation system according to claim 12 wherein the crystal growth is according to the Czochralski process.

14. An interface angle estimation system according to claim 11 wherein the control system includes an interface shape reconstructor and an interface shape controller and wherein the means for determining the interface angle provides the interface angle to the shape reconstructor and the shape controller.

15. An interface angle estimation system according to claim 14 wherein the interface angle is used as a feedback signal in the control system.

16. An interface angle estimation system according to claims 1 or 12 wherein the apparatus for determining the interface angle calculates the angle according to the formula:

$$\theta_i = \tan^{-1}\left[\frac{\delta \frac{\Delta T_1}{\Delta \eta} - \beta C_f \frac{\Delta T_2}{\Delta \epsilon}}{\gamma \frac{\Delta T_1}{\Delta \eta} - \alpha C_f \frac{\Delta T_2}{\Delta \epsilon}}\right]$$

where $$C_f = \frac{k_2}{k_1} + \frac{\rho H_f (\underline{A} * \underline{V})}{k_1 (\underline{A} * \nabla \underline{T_2})}$$

and $\underline{v}$ is a local relative velocity of molten material through the interface, $\underline{A}$ is a cross-sectional area of a control volume at the interface, $\nabla T$ is the gradient on the liquid side of the interface, k1 and k2 are thermal conductivities of liquid and solid phase of a crystal material, $\rho$ is a density of the solid phase of the crystal material, $H_f f$ is a specific heat of fusion of the crystal material, $\Delta T_1$ and $\Delta T_2$ are measured temperature gradients taken at points and $\Delta \eta$ along $\Delta \epsilon$ vectors $\vec{S_1}$ and $\vec{S_2}$ where $S_1$ is represented by coordinates $(\alpha, \beta)$ and $S_2$ is represented by coordinates $(\gamma, \delta)$, and where $\theta_i$ is the inner surface contact angle.

17. A method for determining an interface angle $\theta_i$ at an interface triple junction of a crystal growing from a melt material comprising the steps:

measuring temperature gradients along vectors extending from a triple junction, measuring a surface orientation of the crystal and a crystal meniscus; and calculating $\theta_i$ using those measurements.

18. A method according to claim 17 wherein the temperature gradients $\Delta T_1$ and $\Delta T_2$ are measured at points $\Delta \eta$ and $\Delta \epsilon$ along the vectors; the surface orientation is measured along unit vectors $\vec{S_1}$ and $\vec{S_2}$ where $S_1$ is represented by coordinates $(\alpha, \beta)$ and $S_2$ is represented by the coordinates $(\gamma, \delta)$; and $\theta_i$ is calculated according to the formula:

$$\theta_i = \tan^{-1}\left[\frac{\delta \frac{\Delta T_1}{\Delta \eta} - \beta C_f \frac{\Delta T_2}{\Delta \epsilon}}{\gamma \frac{\Delta T_1}{\Delta \eta} - \alpha C_f \frac{\Delta T_2}{\Delta \epsilon}}\right]$$

where $$C_f = \frac{k_2}{k_1} + \frac{\rho H_f (\underline{A} * \underline{V})}{k_1 (\underline{A} * \nabla \underline{T_2})}$$

and $\underline{v}$ is the local relative velocity of the molten material through the interface, $\underline{A}$ is the cross sectional area of a control volume at the interface, k1 and k2 are the thermal conductivities of liquid and solid phases of the crystal material, $\rho$ is the density of the solid phase of the crystal material, and $H_f$ is the specific heat of fusion of the crystal material.

* * * * *

UNITED STATES PATENT AND TRADEMARK OFFICE
CERTIFICATE OF CORRECTION

Page 1 of 2

PATENT NO. : 4,943,160
DATED : 7/24/90
INVENTOR(S) : Gevelber, Michael A. and Patera, Anthony T.

It is certified that error appears in the above-identified patent and that said Letters Patent is hereby corrected as shown below:

Col. 1, line 6, "F33615-83-C-5284" should be --F33615-83-C-5089--.

Column 1, line 41, "materials" should be --material's--.

Column 2, line 62, insert --.-- after "$\theta_i$".

Column 2, line 68, insert --.-- after "transformation".

Column 4, line 15, delete "interface rear the--.

Column 5, line 46; insert --.-- after "region".

Column 6, line 14, insert --of-- after "sources".

Column 6, line 42, "polarizer" should be "Polarizer".

Column 8, line 10, "$\underset{\sim}{V}_1 F_2 = 0$" should be --$\underset{\sim}{V}F_2=0$--.

Column 8, line 20, "$\underset{\sim}{V}_{1r}$" should be --$\underset{\sim}{V}$--.

Column 8, line 47, "x" should be --$\vec{x}$--.

Column 9, line 7, "$\underset{\sim}{V}_1(i)\cos$" should be --$\underset{\sim}{V}(i)\cos$--.

Column 9, line 33, "x" should be --$\vec{x}$--.

Column 9, line 64, insert a hyphen between "solid liquid".

UNITED STATES PATENT AND TRADEMARK OFFICE
CERTIFICATE OF CORRECTION

Page 2 of 2

PATENT NO. : 4,943,160

DATED : 7/24/90

INVENTOR(S) : Gevelber, Michael A. and Patera, Anthony T.

It is certified that error appears in the above-identified patent and that said Letters Patent is hereby corrected as shown below:

Column 10, line 17, after "data" insert --from around the triple junction and the surface imager provides--.

Column 12, line 20, delete "→" on top of --$S_1$ and $S_2$--.

Column 12, line 37, "$\underset{\sim}{v}$" should be --V--.

Signed and Sealed this

Twenty-sixth Day of March, 1991

Attest:

HARRY F. MANBECK, JR.

Attesting Officer

Commissioner of Patents and Trademarks